(12) United States Patent
Skotnicki et al.

(10) Patent No.: US 7,224,015 B1
(45) Date of Patent: May 29, 2007

(54) METHOD FOR MAKING A STACK OF CAPACITORS, IN PARTICULAR FOR DYNAMIC RANDOM ACCESS MEMORY [DRAM]

(75) Inventors: Thomas Skotnicki, Crolles-Montfort (FR); Malgorzata Jurczak, Grenoble (FR); Catherine Mallardeau, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 406 days.

(21) Appl. No.: 10/129,881

(22) PCT Filed: Nov. 10, 2000

(86) PCT No.: PCT/FR00/03153

§ 371 (c)(1),
(2), (4) Date: Sep. 30, 2002

(87) PCT Pub. No.: WO01/35448

PCT Pub. Date: May 17, 2001

(30) Foreign Application Priority Data

Nov. 10, 1999 (FR) .................................. 99 14105

(51) Int. Cl.
*H01L 27/108* (2006.01)
(52) U.S. Cl. ................ 257/306; 257/308; 257/E21.648
(58) Field of Classification Search ......... 257/300–310
See application file for complete search history.

(56) References Cited

U.S. PATENT DOCUMENTS

| 5,155,657 A | * | 10/1992 | Oehrlein et al. ............ 361/313 |
| 5,622,882 A | * | 4/1997 | Yee ............................. 438/210 |
| 6,127,220 A | * | 10/2000 | Lange et al. ................ 438/254 |

* cited by examiner

*Primary Examiner*—H. Jey Tsai
(74) *Attorney, Agent, or Firm*—Lisa K. Jorgenson; Allen, Dyer, Doppelt, Milbrath & Gilchrist, P.A.

(57) ABSTRACT

The invention concerns a method which consists in forming on a substrate (1) coated with a dielectric material layer (3) provided with a window (3*a*), a stack of successive layers alternately of germanium or SiGe alloy (4, 6, 8) and polycrystalline silicon (5, 7, 9); selective partial elimination of the germanium or SiGe alloy layers, to form an tree-like structure; forming a thin layer of dielectric material (10) on the tree-like structure; and coating the tree-like structure with polycrystalline silicon (11). The invention is useful for making dynamic random-access memories.

14 Claims, 4 Drawing Sheets

METHOD FOR MAKING A STACK OF CAPACITORS, IN PARTICULAR FOR DYNAMIC RANDOM ACCESS MEMORY [DRAM]

FIELD OF THE INVENTION

This invention generally concerns a method for making a stack of capacitors, in particular for Dynamic Random Access Memory [DRAM].

BACKGROUND OF THE INVENTION

As shown in FIGS. 1a through 1e, the conventional methods of making a stack of capacitors, in particular for creating Dynamic Random Access Memory consist in forming, on a silicon substrate 1, comprising a highly doped area 2 adjacent to a main surface of the substrate, then, on the main surface of the substrate, a stack of successive layers alternately of dielectric material 4, 6, 8, of $SiO_2$ for instance, and of polycrystalline silicon (poli Si) 5, 7, sandwiched between layers of dielectric material 4, 6 8 (FIG. 1a). A hole 9 is etched through the stack of successive layers alternately of dielectric material 4, 6, 8 and of poly Si 5, 7, to expose the surface of the highly doped area 2 of the silicon substrate.

As shown in FIG. 1b, a layer of polycrystalline silicon is then deposited on the surface of the external layer 8 of $SiO_2$ of the stack, as well as on the walls of the hole 9, in order to shunt the layers of polycrystalline silicon 5 and 7 sandwiched between the $SiO_2$ layers 4, 6 and 8.

As shown in FIG. 1c, $SiO_2$ layers 4, 6 and 8 are eliminated to form an arborescent structure; its trunk is made up of the part of the poly Si layer 10 coating the walls of the hole 9, and its branches are made up of the layers of polycrystalline silicon 5 through 7 of the stack and the part of the polycrystalline silicon layer 10 initially coating the $SiO_2$ external layer 8.

As shown in FIG. 1d, a thin layer of dielectric material, $SiO_2$ for instance, is formed on this arborescent structure of polycrystalline silicon, either by deposit, or by thermal oxidation of polycrystalline silicon, in such a way that it leaves a void in the central hole 9 and spaces in between the polycrystalline silicon branches 5, 6 [should be 7] and 10 and the substrate 1.

The voids of the arborescent structure are then filled in, and the arborescent structure is coated with polycrystalline silicon, as shown in FIG. 1e.

Contacts are then created on the polycrystalline silicon coating.

This method has several drawbacks.

First of all, applying a deposit of dielectric material and of polycrystalline silicon calls for the use of two distinct chambers.

On the other hand, the lack of selectivity between the $SiO_2$ layers that are sandwiched between the polycrystalline silicon layers and all the other surrounding $SiO_2$ layers, such as passivation layers, insulating filling material, etc., harms the method and requires the use of barrier levels.

Finally, since the conductive polysilicon layers are being sandwiched in between dielectric layers, the method calls for additional masking steps to etch a hole through the stack, in a way to shunt the conductive layers with a polycrystalline silicon deposit inside the holes.

SUMMARY OF THE INVENTION

Therefore, the object of this invention is a method for making a stack of capacitors, in particular for Dynamic Random Access Memory that remedies the drawbacks of the method of prior art, and, in particular, that is simple, allowing the deposit of the various layers of the stack of capacitors inside a single chamber, and that does not require any particular step to establish the contact between the different polycrystalline silicon layers.

According to this invention, the method for making a stack of capacitors on a main surface of a semiconductor substrate includes:

a) Forming in the semiconductor substrate a highly doped area adjacent to said main surface;

b) Forming a layer of dielectric material on the substrate main area;

c) Forming in the layer of dielectric material a window exposing an area of the surface of the substrate above the highly doped area.

d) Forming on the layer of dielectric material and on the exposed area of the main substrate surface a stack of layers alternately of germanium or SiGe alloy and polycrystalline silicon, the first layer of the stack in contact with the layer of dielectric material and the exposed area being a layer of germanium or SiGe alloy and the last layer of the stack being a layer of polycrystalline silicon.

e) Masking and etching the stack to achieve the desired size and geometry for the stack.

f) Elimination by selective lateral etching of the germanium or SiGe alloy layers, with the exception of the parts of these layers placed above de exposed area of the main substrate surface, in order to form an arborescent structure comprising a central trunk made up alternately of germanium or SiGe alloy and polycrystalline silicon, and polycrystalline silicon branches extending from the trunk and separated from each other and from the substrate by hollowings, the said arborescent structure having an external surface.

g) Forming on the external surface of the arborescent structure a thin layer of dielectric material, in order to save the hollowings; and h) Coating the arborescent structure covered by a thin layer of dielectric material and filling in the hollowings with polycrystalline silicon.

Contrary to the method of prior art, the stack layers of the method for this invention can be deposited with the use of a single chamber.

Furthermore, the high degree of selectivity when etching germanium or SiGe alloys (most particularly alloys with a sufficiently high germanium molar fraction) when compared to silicon and to $SiO_2$, allows for the elimination of germanium or SiGe alloy without affecting polycrystalline silicon or $SiO_2$.

Finally, due to the high level of conductivity of germanium or polycrystalline SiGe alloy, contact between the polysilicon layers can be established without any special step.

The polycrystalline silicon, germanium or SiGe alloy deposits can be achieved by any conventional methods such as vapor phase epitaxy and chemical deposit.

The SiGe alloys are well known and we can mention $Si_{1-x}Ge_x$ alloys, whereby $0<x<1$ and $Si_{1-x-y}Ge_xC_y$ alloys, whereby $0<x\leq0.95$ and $0<y\leq0.05$. For selective etching, we recommend choosing SiGe alloys with a relatively high rate of germanium, preferably alloys whereby x is superior or equal to 0.1.

In order to ensure a good selectivity and a relatively simple manufacturing process, germanium in the SiGe alloy should preferably remain between 25 and 55%.

Selective etching of germanium and SiGe alloys is also well known. We can use, for instance, a method of etching through oxidizing chemistry, such as a solution of 40 ml $HNO_3$ 70%+20 ml $H_2O_2$+5 ml HF 0.5% or an isotope plasma etching.

In order to form layers of dielectric material for the method of this invention, we can use any suitable dielectric material, such as, for example, $Ta_2O_5$, $TiO_2$, $Si_3N_4$ or $SiO_2$. The preferred dielectric material is $SiO_2$.

Dielectric material deposits can be achieved through any conventional method, such as a vapor phase chemical deposit, plasma deposit, kiln oxidation, etc . . . . In particular, when the dielectric material is $SiO_2$, it can be formed through thermal oxidation of silicon or SiGe alloy layers.

This invention also concerns a semiconductor device comprising, on a highly doped area adjacent to a main silicon substrate surface, a central trunk made up of a stack of polycrystalline silicon layers separated by germanium or SiGe alloy central parts.

This invention also concerns a semiconductor device comprising a silicon substrate in which a highly doped area is formed adjacent to a main substrate surface provided with a window opening on a part of the main surface above the highly doped area, and on the dielectric material layer, a stack of capacitors comprising a first and a second polycrystalline silicon structures that are intercrossed [interdigitized] and electrically insulated from each other by a layer of dielectric material, characterized in that the first intercrossed [interdigitized] structure comprises layers of polycrystalline silicon electrically linked between each other and to the highly doped area of the substrate by germanium or SiGe alloy parts.

BRIEF DESCRIPTION OF THE DRAWINGS

The rest of the description refers to the attached figures representing, respectively:

As shown in FIG. 2a, the method of the invention starts in a conventional manner by forming in a silicon substrate 1 of a highly doped area 2, $N^{+,}$ for instance. Standard masking and ionic implantation, for instance, can create this highly doped area 2.

DETAILED DESCRIPTION OF THE PREFERRED EMBODIMENTS

On the surface of the substrate, we form a thin layer of dielectric material 3, $SiO_2$ for instance, then, through standard masking and etching, we form, within this dielectric layer 3, a window 3a above the highly doped area 2 of the substrate to ensure future contact between the highly doped area 2 and the first layer of germanium or polycrystalline alloy SiGe. SiGe alloy can be a minority category such as C.

Figure 1A:
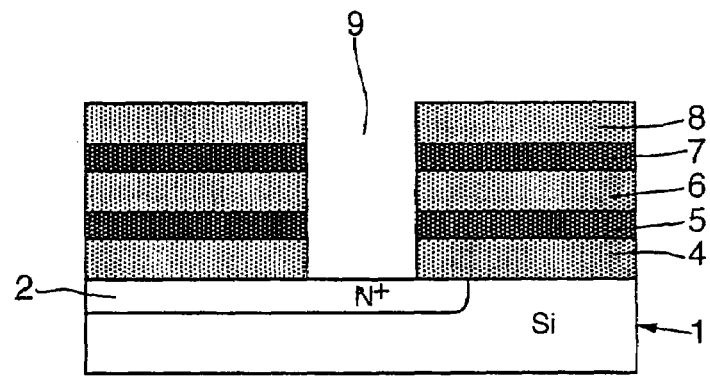
FIGS. 1a through 1e—the main steps of a method for making a stack of capacitors of prior art.
Figure 1B:
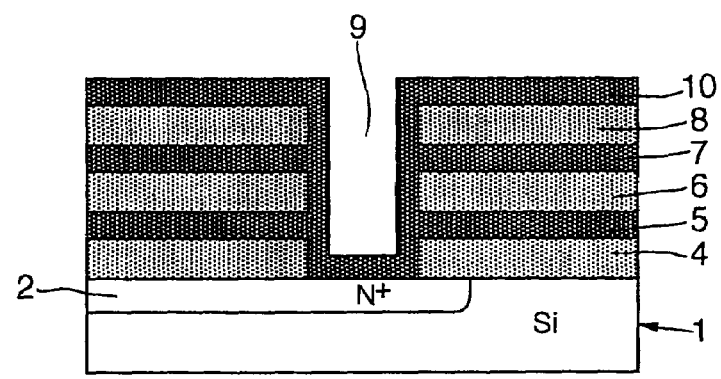
Figure 1C:
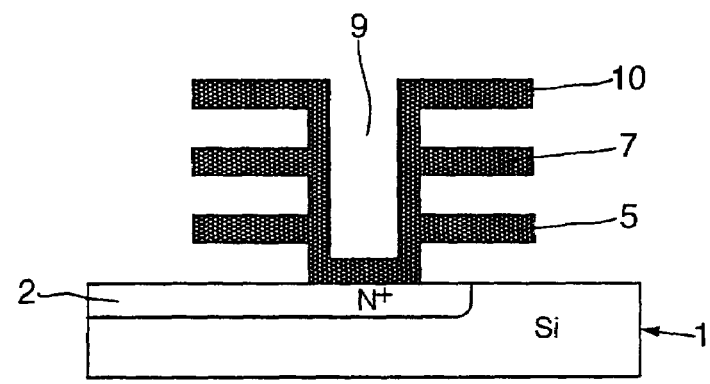
Figure 1D:
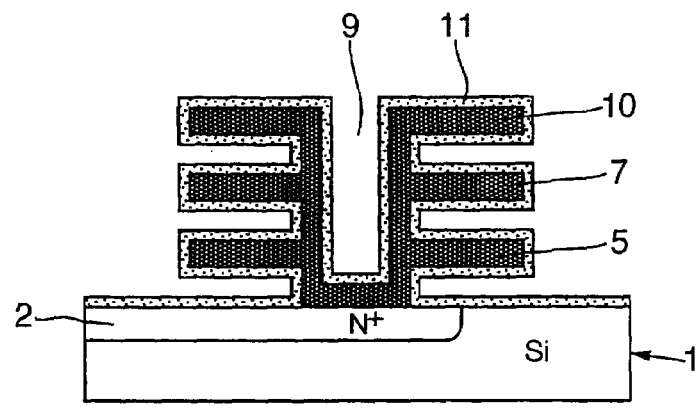
Figure 1E:
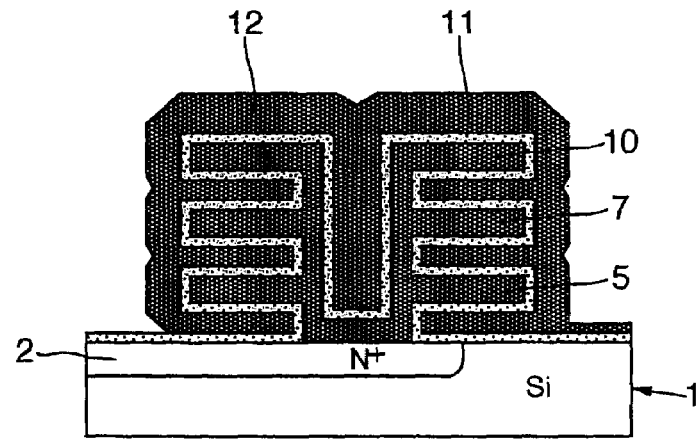
Figure 2A:
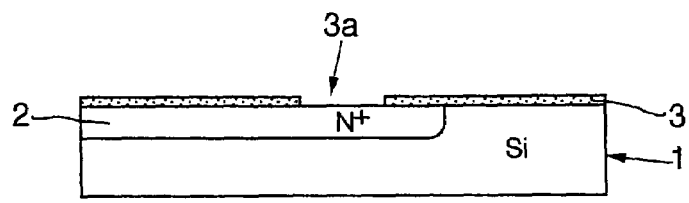
FIGS. 2a through 2e—the main steps of creating a manufacturing process according to the invention.
Figure 2B:
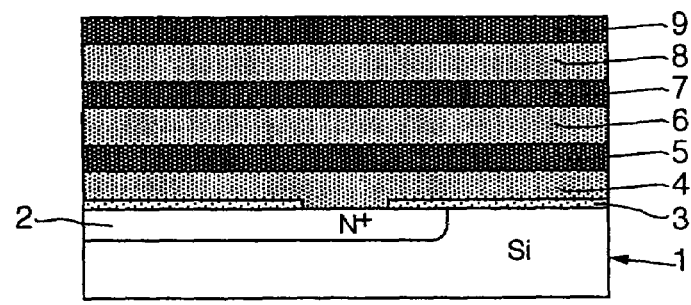

As shown in FIG. 2b, we then proceed in a conventional manner, in a single step, using a single chamber, with an alternate deposit of layers 4, 6, 8 of germanium or SiGe alloy and of layers 5, 7, 9 of polycrystalline silicon to form a stack of which the first layer in contact with the substrate is the germanium or SiGe alloy layer 4 and the last layer is the polycrystalline silicon layer 9.

Although we have represented a six-layer stack, which are three layers of germanium or SiGe alloy and three layers of polycrystalline silicon, the stack can have a larger number of layers or only two layers of germanium or germanium alloy and three layers of polycrystalline silicon. However, the first layer that is in contact with the substrate must be a layer of germanium or SiGe alloy and the last layer of the stack must be a layer of polycrystalline silicon.

Figure 2C:
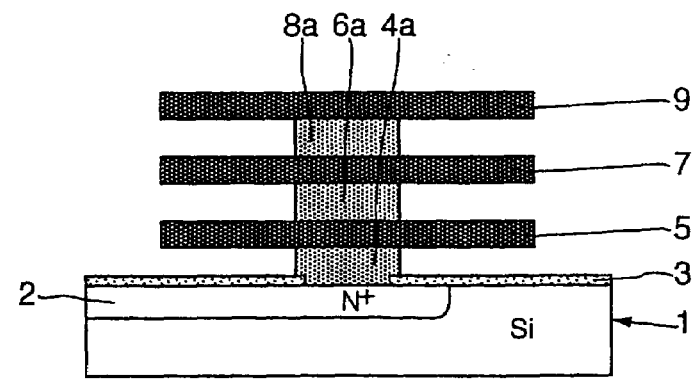

We then proceed, as shown in FIG. 2c, with the selective lateral etching of the germanium or SiGe alloy layers, through oxidizing chemistry, for instance, as described above. This etching is achieved in such a way that the layers 4, 6, 8 of germanium or SiGe alloy are partly eliminated, but that the central parts 4a, 6a, 8a of those layers above the window 3a are maintained. An arborescent structure is then formed which includes a central trunk made up of these remaining parts 4a, 6a, 8a from the SiGe layers and of the corresponding parts of polycrystalline silicon layers 5, 7, 9. The parts of the polycrystalline silicon layers 5, 7, 9 extending beyond the trunk, form branches that are separated between each other by hollowings. Likewise, the part of the first polysilicium layer 5 that extends beyond the trunk is separated from the dielectric layer 3 by a hollowing.

Figure 2D:
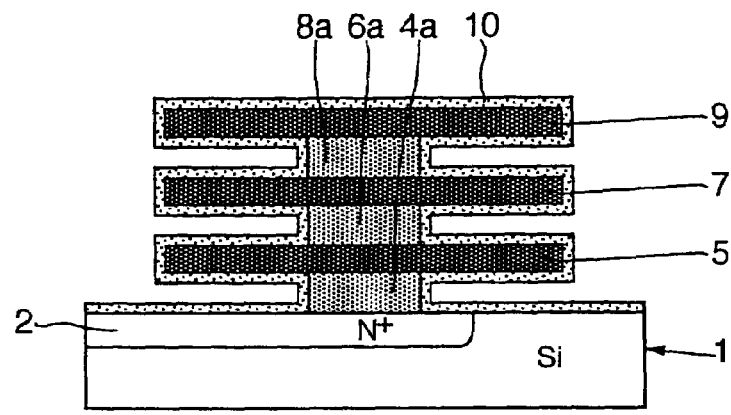
Figure 2E:
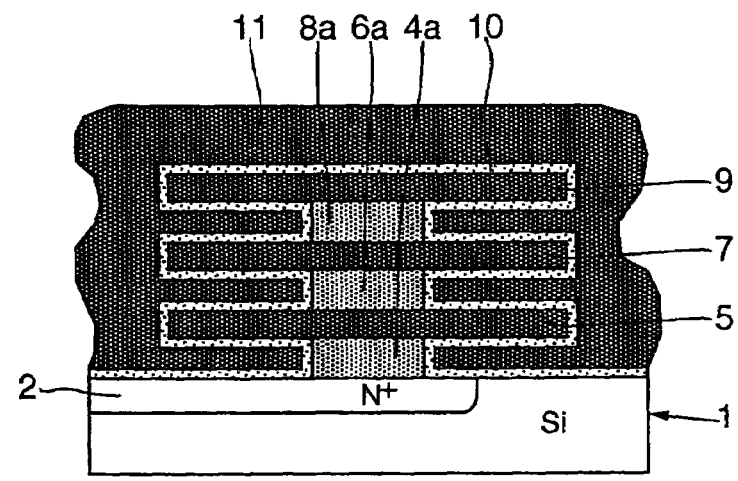

The following step, as shown in FIG. 2d, consists in creating, on the external surface of the arborescent structure, a thin layer of dielectric material 10. This layer of dielectric material can be a layer of oxide that can be the result of thermal oxidation of the structure, for instance, or of the deposit of a layer of dielectric material.

As shown in FIG. 2d, the formation of the dielectric layer 10 is such that we keep the hollowings separating the polycrystalline silicon layers from each other as well as from the substrate 1.

We then proceed with the coating of the arborescent structure, already covered with a layer of dielectric material 10, with polycrystalline silicon 11, in a way to also fill in the hollowings.

Finally, we complete the structure by forming the necessary contacts over the polycrystalline silicon coating 11.

The invention claimed is:

1. A semiconductor device comprising:
   a semiconductor substrate; and
   at least one capacitor adjacent said semiconductor substrate and comprising
      alternating layers including at least one germanium layer and at least one polycrystalline silicon layer extending laterally outwardly therefrom defining a tree structure,
   a dielectric layer on outer portions of the tree structure, and
   an electrical conductor on outer portions of the dielectric layer.

2. A semiconductor device in accordance with claim 1 wherein said at least one germanium layer comprises between 10% and 100% germanium.

3. A semiconductor device in accordance with claim 1 wherein said at least one germanium layer comprises between 25% and 55% germanium.

4. A semiconductor device in accordance with claim 1 wherein said substrate comprises a conductive surface portion, and wherein said alternating layers comprise a first germanium layer contacting said conductive surface portion.

5. A semiconductor device in accordance with claim 4 wherein said conductive surface portion comprises a doped semiconductor surface portion.

6. A semiconductor device in accordance with claim 1 wherein said alternating layers comprise an uppermost polycrystalline silicon layer.

7. A semiconductor device according to claim 1 wherein the at least one polycrystalline silicon layer defines at least one gap with adjacent portions;

and wherein said dielectric layer is relatively thin to preserve the at least one gap.

8. A dynamic random access memory (DRAM) device comprising:

a semiconductor substrate and a plurality of memory cells formed thereon, each memory cell comprising a capacitor;

said capacitor comprising alternating layers including at least one germanium layer and at least one polycrystalline silicon layer extending laterally outwardly therefrom defining a tree structure, a dielectric layer on outer portions of the tree structure, and an electrical conductor on outer portions of the dielectric layer.

9. A DRAM device in accordance with claim 8 wherein said at least one germanium layer comprises between 10% and 100% germanium.

10. A DRAM device in accordance with claim 8 wherein said at least one germanium layer comprises between 25% and 55% germanium.

11. A DRAM device in accordance with claim 8 wherein said semiconductor substrate comprises a conductive surface portion, and wherein said alternating layers comprise a first germanium layer contacting said conductive surface portion.

12. A DRAM device in accordance with claim 11 wherein said conductive surface portion comprises a doped semiconductor surface portion.

13. A DRAM device in accordance with claim 8 wherein said alternating layers comprise an uppermost polycrystalline silicon layer.

14. A DRAM device in accordance with claim 8 wherein the at least one polycrystalline silicon layer defines at least one gap with adjacent portions; and wherein said dielectric layer is relatively thin to preserve the at least one gap.

* * * * *

UNITED STATES PATENT AND TRADEMARK OFFICE
CERTIFICATE OF CORRECTION

PATENT NO. : 7,224,015 B1 Page 1 of 1
APPLICATION NO. : 10/129881
DATED : May 29, 2007
INVENTOR(S) : Thomas Skotnicki, Malgorzata Jurczak and Catherine Mallardeau It is certified that error appears in the above-identified patent and that said Letters Patent is hereby corrected as shown below:

Column 1, Line 46  Delete: "[should be 7]"

Column 2, Line 32  Delete: "de"
Insert: --the--

Column 3, Line 48  Delete: "$N^{+}.$"
Insert: --$N^{+}$,--

Signed and Sealed this

Eighteenth Day of November, 2008

JON W. DUDAS
*Director of the United States Patent and Trademark Office*